United States Patent [19]

Hotta

[11] 4,045,249
[45] Aug. 30, 1977

[54] OXIDE FILM ISOLATION PROCESS
[75] Inventor: Atsuo Hotta, Higashiyamato, Japan
[73] Assignee: Hitachi, Ltd., Japan
[21] Appl. No.: 634,783
[22] Filed: Nov. 24, 1975
[30] Foreign Application Priority Data

Nov. 22, 1974 Japan .................. 49-133658

[51] Int. Cl.$^2$ .......................................... H01L 21/26
[52] U.S. Cl. ...................................... 148/1.5; 148/187
[58] Field of Search .................... 148/1.5, 175, 187
[56] References Cited

U.S. PATENT DOCUMENTS

| 3,622,382 | 11/1971 | Brack et al. ............. 148/1.5 X |
| 3,666,548 | 5/1972 | Brack et al. ............. 148/1.5 UX |
| 3,748,187 | 7/1973 | Aubuchon et al. ......... 148/1.5 |
| 3,947,299 | 3/1976 | Weijland et al. ......... 148/187 |

*Primary Examiner*—G. Ozaki
*Attorney, Agent, or Firm*—Craig & Antonelli

[57] ABSTRACT

In an oxide film isolation process wherein a groove portion is formed in that region of a semiconductor substrate in which an isolation layer is to be formed, oxygen or nitrogen is implanted into the groove portion by ion implantation so as to form an insulating layer beneath the groove portion, and the groove portion is thereafter oxidized to thus form an oxide of the semiconductor substrate in a manner to join the oxide and the insulating layer, whereby the area in a semiconductor chip surface as occupied by the isolation layer can be made small to enhance the density of integration of an integrated circuit.

7 Claims, 10 Drawing Figures

OXIDE FILM ISOLATION PROCESS

BACKGROUND OF THE INVENTION

This invention relates to an oxide film isolation process.

In the manufacture of semiconductor integrated circuit devices, it has become an important process to provide an isolation layer in order to make respective elements electrically independent. One of the techniques for forming the isolation layer is the oxide film isolation process (refer to 'Denshi Zairyo (Electronic Material)' March 1974, pp. 53 – 54). This process forms the isolation layer in such way that a groove is formed by, for example, chemical etching in that area of a semiconductor substrate in which the isolation layer is to be formed, and that the vicinity of the groove portion is subjected to selective oxidation. The merits of the oxide film isolation process are as follows. (1) Since the surface of the semiconductor substrate can be made flat, an internal wiring which is disposed on the semiconductor substrate surface is prevented from being disconnected. (2) Since the isolation and the patterning of base and collector contacts can be concurrently performed by the use of a single mask, the alignment error of the mask need not be considered, whereby the semiconductor chip area can be diminished. (3) Even when, in the step of selective oxidation, the mask pattern is formed with defective parts in an area other than the area for the selective oxidation on account of, e.g., pinholes in a photoresist film, the defective parts merely have the oxide film grown thereat and they exert no great influence on the essential circuit characteristics, so that a sharp enhancement of yield can be expected. With this process, however, unless the bottom part of the isolation layer reaches a buried layer, inferior isolation (that is, the short-circuit between the semiconductor substrate and a base layer) will take place. The bottom part of the isolation layer must therefore be designed so as to be deep enough to arrive at the buried layer. The lateral width of the isolation layer is accordingly made large, so that the area which the isolation layer occupies in the semiconductor chip surface becomes large.

SUMMARY OF THE INVENTION

It is therefore an object of this invention to provide an oxide film isolation process which reduces the area occupied by the isolation layer in the semiconductor chip surface and which thereby achieves the enhancement of the density of integration.

The fundamental construction of this invention for accomplishing the object consists in that a groove portion is formed in that area of a semiconductor substrate in which an isolation layer is to be formed; that oxygen or nitrogen is implanted into the groove portion by the ion implantation process, to form an insulating layer beneath the groove portion; and that the groove portion is thereafter oxidized, thereby to form an oxide of the semiconductor substrate here and to join the oxide and the insulating layer.

BRIEF DESCRIPTION OF THE DRAWINGS

FIGS. 1a to 1e are constructional views showing an embodiment of the oxide film isolation process according to this invention, while

PREFERRED EMBODIMENTS OF THE INVENTION

Hereunder this invention will be described along embodiments thereof.

Figure 1A:
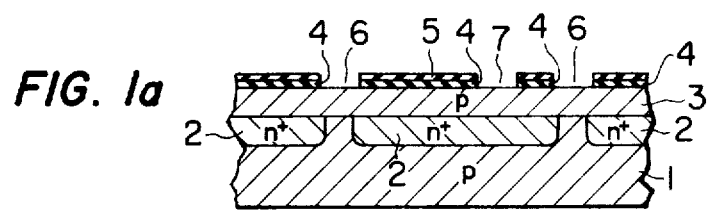
Figure 1B:
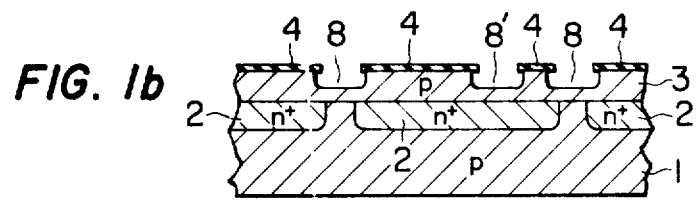
Figure 1C:
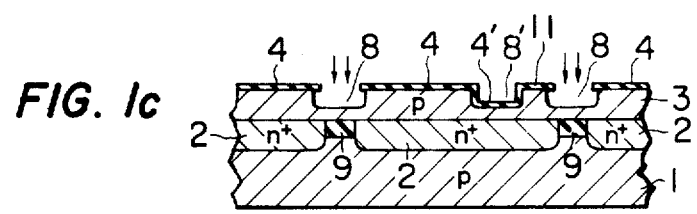
Figure 1D:
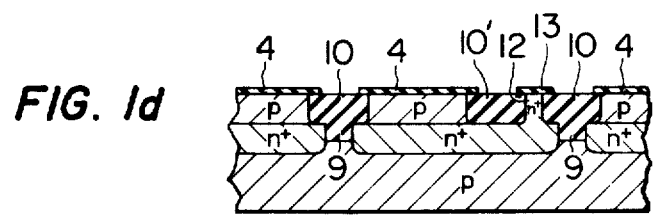
Figure 1E:
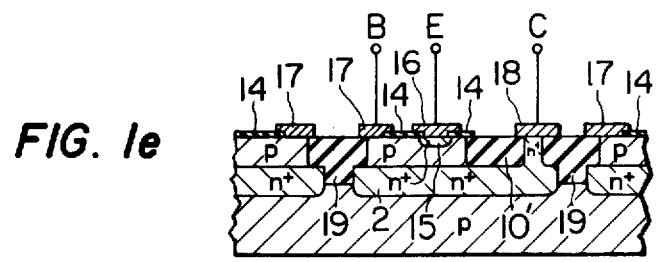

FIGS. 1a to 1e are process diagrams which illustrate an embodiment of the oxide film isolation process according to this invention. In a principal surface of a p-type silicon semiconductor substrate 1, an n-type impurity is selectively diffused at a high concentration, to form a plurality of n+-type buried layers 2. On the resultant p-type silicon semiconductor substrate 1 formed with the buried layers 2, a p-type silicon layer 3 is formed by the epitaxial growth. Thereafter, a silicon nitride film 4 and a silicon oxide film 5 are formed into a layer on the surface of the p-type layer 3. The nitride film 4 and the oxide film 5 are perforated by the selective etching at an area 6 at which the isolation layer is to be formed within the p-type layer 3 and at an area 7 at which a base layer and a collector layer, to be described later, are to be isolated. In this case, the oxide film 5 is perforated by known photoetching techniques, whereupon the nitride film 4 is perforated with a suitable etchant by employing the resultant oxide film 5 as a mask (refer to FIG. 1a).

Thereafter, the oxide film 5 having been used as the mask for the perforation of the nitride film 4 is fully removed. By employing the nitride film 4 as a mask, the p-type layer 3 is formed with groove portions 8 and 8' by the use of a suitable etchant. In this case, the depth of the groove portion is made smaller than in the prior-art method (refer to FIG. 1b).

The groove portion 8' formed in the region which is to isolate the base layer and the collector layer is formed with a nitride film 4', while the groove portion 8 formed in the region in which the isolation region is to be formed is implanted with oxygen by an ion implantation process. At this time, a silicon oxide layer 9 is formed beneath the groove portion 8 and near the depth at which the buried layer 2 is formed. Although, at this step, oxygen is implanted by an ion implantation process, nitrogen may be used instead. In the latter case, a silicon nitride layer is formed (refer to FIG. 1c).

The nitride film 4' formed by the preceding step is selectively removed by the use of a suitable etchant, and the surfaces of the groove portions 8 and 8' are oxidized by high heat. Then, a silicon oxide film 10' is formed in the region which is to isolate the base layer and the collector layer, while a silicon oxide film 10 is formed in the region which is to form the isolation layer. The oxide film 10 is brought into the state in which it joins with the oxide layer 9 formed by the previous step. Thus, a deep isolation layer can be formed. Thereafter, a nitride film 11 (refer to FIG. 1c) formed between the oxide films 10' and 10 is selectively removed to expose a part of the p-type layer 3. Here, an n-type impurity is diffused at a high concentration to the extent that the buried layer 2 is reached. Thus, an electrode leading-out n+-layer 12 for the buried layer 2 being the collector layer is formed. At the diffusion step, an oxide film 13 is formed on the surface of the electrode leading-out layer 12 (refer to FIG. 1d).

The nitride film 4 and the oxide film 13, which remain on the surface of the semiconductor substrate 1 subjected to the surface treatment as described above, are fully removed. An oxide film 14 is formed on the surface anew by a known CVD (chemical vapor deposition) process. The oxide film 14 overlying a region in which an emitter layer is to be formed is perforated. An n-type impurity is diffused at a high concentration through the perforated part, to form the emitter layer 15. In this way, an n-p-n transistor in which the p-type layer 3 becomes the base layer and the buried layer 2 becomes the collector layer is formed. Thereafter, as is well known, the oxide film 14 overlying the emitter layer, the base layer and the collector layer is formed with openings, and an emitter electrode 16, a base electrode 17 and a collector electrode 18 are formed in the openings (refer to FIG. 1e).

With such an expedient wherein the groove portion is formed in that area of the semiconductor substrate in which the isolation layer is to be formed, oxygen or nitrogen is implanted into the groove portion by the ion implantation process, to form the insulating layer beneath the groove portion beforehand, and the groove portion is thereafter oxidized, thereby to form the oxide of the semiconductor substrate here and to join the oxide and the insulating layer; the deep isolation layer can be formed even if the groove portion is not formed to be deep. The fact that the groove portion need not be formed to be deep signifies that the etching of the groove portion in the lateral direction is slight in view of the nature of the etching. Even when the isolation layer is formed by oxidizing the groove portion, a layer of small width can be acquired. It is accordingly possible to reduce the area in the semiconductor chip surface as occupied by the isolation layer and to enhance the density of integration.

Figure 2A:
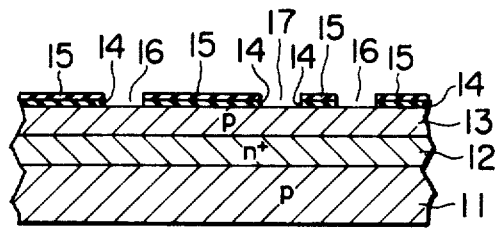
FIGS. 2a to 2e are constructional views showing another embodiment of the oxide film isolation process according to this invention.
Figure 2B:
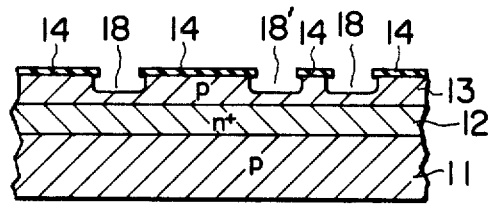
Figure 2C:
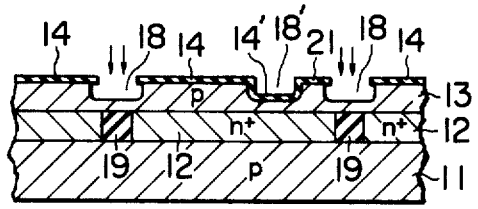
Figure 2D:
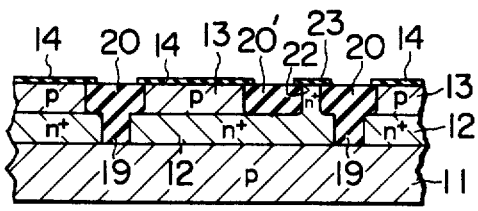
Figure 2E:
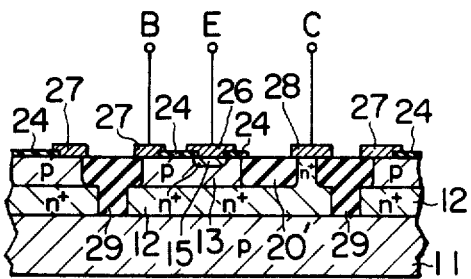

FIGS. 2a to 2e are process diagrams which illustrate another embodiment of the oxide film isolation process according to this invention. In a principal surface of a p-type silicon semiconductor substrate 11, an impurity of, e.g., the n-type is diffused at a high concentration over the entire area, to form an n+-type buried layer 12. On the surface of the buried layer 12, a p-type silicon layer 13 is formed by epitaxial growth. Thereafter, a silicon nitride film 14 and a silicon oxide film 15 are formed into a layer on the surface of the p-type layer 13. The nitride film 14 and the oxide film 15 at an area 16 at which an isolation layer is to be formed within the p-type layer 13 and at an area 17 at which a base layer and a collector layer, to be stated later, are to be isolated, are selectively etched and are perforated (refer to FIG. 2a).

Thereafter, the oxide film 15 having been used as the mask for the perforation of the nitride film 14 is fully removed. By employing the nitride film 14 as a mask, groove portions 18 and 18' are formed in the surface of the p-type layer 13 by the use of a suitable etchant. In this case, the groove portion is made shallower than in the prior art (refer to FIG. 2b).

The groove portion 18' formed in the region which is to isolate the base layer and the collector layer is formed with a nitride film 14'. On the other hand, the groove portion 18 formed in the region which is to form the isolation layer is implanted with oxygen by an ion implantation process. At this time, a silicon oxide layer 19 is formed beneath the groove portion 18 and near the depth at which the buried layer 12 is formed. In addition, the buried layer 12 is isolated or divided by the oxide layer 19. Although, at this step, oxygen is implanted by an ion implantation process, nitrogen may be used instead. In the latter case, a silicon nitride layer is formed (refer to FIG. 2c).

The nitride film 14' formed by the preceding step is selectively removed by the use of a suitable etchant. The surfaces of the groove portions 18 and 18' are oxidized by high heat. Then, a silicon oxide film 20' is formed in the region which is to isolate the base layer and the collector layer, while a silicon oxide film 20 is formed in the region which is to form the isolation layer. The oxide film 20 is brought into the state in which it joins with the oxide layer 19 formed by the previous step. Thus, a deep isolation layer can be formed. Thereafter, a nitride film 21 (refer to FIG. 2c) formed between the oxide films 20' and 20 is selectively removed to expose a part of the p-type layer 13. Here, an n-type impurity is diffused at a high concentration to the extent that the buried layer 12 is reached. Thus, an electrode leading-out layer 22 of the n+-type for the buried layer 12 being the collector layer is formed. At the diffusion step, a silicon oxide film 23 is formed on the surface of the electrode leading-out layer 22 (refer to FIG. 2d).

The nitride film 14 and the silicon oxide film 23, which remain on the surface of the semiconductor substrate 11 subjected to such surface treatment, are fully removed. A silicon oxide film 24 is formed on the surface anew by the known CVD process. The oxide film 24 overlying a region in which an emitter layer is to be formed is perforated. An n-type impurity is diffused at a high concentration through the perforated part, to form the n+-type emitter layer 25. In this way, there is formed an n-p-n transistor in which the p-type layer 13 becomes the base layer in which the buried layer 12 becomes the collector layer. Thereafter, as is well known, the oxide film 24 overlying the emitter layer, the base layer and the collector layer is formed with openings, and an emitter electrode 26, a base electrode 27 and a collector electrode 28 are formed in the openings (refer to FIG. 2e).

With such an expedient, the enhancement of the density of integration can be achieved for the same reason as stated in connection with the embodiment of FIGS. 1a to 1e. Moreover, since the selective formation of the buried layers becomes unnecessary, the complicated mask step can be obviated.

Although, in the foregoing embodiments, the case of manufacturing the n-p-n transistor has been explained, it is a matter of course that this invention can be utilized also in a case of manufacturing a p-n-p transistor.

Although the foregoing embodiments employ the silicon nitride film as the mask for the ion implantation, a silicon oxide film may of course be used.

This invention is applicable to any semiconductor devices to be formed with an isolation layer, such as a bipolar type integrated circuit device and a MIS (metal insulated structure) type integrated circuit device of the LOCOS (locally oxidized silicon) structure.

As set forth above, according to the oxide film isolation process of this invention, it is possible to diminish the area in the semiconductor chip surface as occupied by the isolation layer and to achieve the enhancement of the density of integration.

I claim:
1. A method of manufacturing a semiconductor device comprising the steps of:
   a. selectively forming a masking layer on one principal surface of a semiconductor substrate having the same crystalline structure throughout beneath said surface, said masking layer having a window which exposes a portion of said one principal surface of said substrate;

b. removing semiconductor material through said window from said substrate so as to form a groove in the exposed portion of the one principal surface of said substrate;

c. selectively implanting, through said window in said masking layer, ions of at least one element consistng of the group consisting of oxygen and nitrogen into said substrate, thereby forming a buried insulator layer spaced beneath the bottom of said groove by a prescribed distance; and d. oxidizing that portion of said substrate exposed by said groove and not masked by said masking layer so as to form an insulator layer which fills said groove and extends therebeneath to be contiguous with said buried insulator layer.

2. A method according to claim 1, further comprising the step (e) of forming, prior to step (b), a plurality of spaced-apart buried layers of semiconductor material of a selected conductivity type at selected positions within said substrate buried a predetermined depth from said one principal surface of said substrate, and wherein step (b) for forming said groove is carried out so as to overlie the material of said substrate by way of which said buried layers of semiconductor material are spaced apart, the depth of said groove being less than said predetermined depth.

3. A method according to claim 2, wherein step (c) is carried out so that said buried insulator layer is formed in the portion of said substrate separating said buried layers of semiconductor material from each other.

4. A method according to claim 2, further comprising the steps of:

f. forming a further groove in a surface portion of said substrate overlying a selected buried semiconductor layer;

g. masking said further groove prior to step (c) so that ions are not implanted beneath said further groove; and h. oxidizing said substrate beneath said further groove during step (d) so as to form an isolation layer which extends to said selected buried semiconductor layer.

5. A method according to claim 1, further comprising the step (e) of forming, prior to step (b), a continuous buried layer of semiconductor material of a selected conductivity type at a predetermined depth from said one principal surface of said substrate, and wherein step (b) for forming said groove is carried out so as to overlie a region to form an isolation region, the depth of said groove being less than said predetermined depth.

6. A method according to claim 5, wherein said insulator layer is formed so as to form said isolation region which surrounds a prescribed portion of said buried semiconductor layer and extends through the thickness of said buried semiconductor layer.

7. A method according to claim 5, further comprising the steps of:

f. forming a further groove in a surface portion of said substrate overlying a selected portion of said buried semiconductor layer;

g. masking said further groove prior to step (c) so that ions are not implanted beneath said further groove; and h. oxidizing said substrate beneath said further groove during step (d) so as to form an isolation layer which extends to said selected portion of said buried semiconductor layer.

* * * * *